US012588139B2

(12) United States Patent
　　Koshimizu

(10) Patent No.:　US 12,588,139 B2
(45) Date of Patent:　　Mar. 24, 2026

(54) WIRING BOARD AND METHOD FOR MANUFACTURING WIRING BOARD

(71) Applicant: Fujikura Ltd., Tokyo (JP)

(72) Inventor: Kazutoshi Koshimizu, Chiba (JP)

(73) Assignee: Fujikura Ltd., Tokyo (JP)

( * ) Notice: Subject to any disclaimer, the term of this patent is extended or adjusted under 35 U.S.C. 154(b) by 212 days.

(21) Appl. No.: 18/249,537

(22) PCT Filed: Nov. 15, 2021

(86) PCT No.: PCT/JP2021/041970
　　§ 371 (c)(1),
　　(2) Date: Apr. 18, 2023

(87) PCT Pub. No.: WO2022/102779
　　PCT Pub. Date: May 19, 2022

(65) Prior Publication Data
　　US 2023/0397328 A1　　Dec. 7, 2023

(30) Foreign Application Priority Data

Nov. 16, 2020　(JP) ................................. 2020-190295

(51) Int. Cl.
　　*H05K 1/02*　　　　(2006.01)
　　*H05K 1/11*　　　　(2006.01)
　　　　(Continued)

(52) U.S. Cl.
　　CPC ......... *H05K 1/0281* (2013.01); *H05K 1/0278* (2013.01); *H05K 1/0283* (2013.01);
　　　　(Continued)

(58) Field of Classification Search
　　CPC .... H05K 1/0281; H05K 1/0283; H05K 3/007; H05K 1/118; H05K 2201/2009;
　　　　(Continued)

(56) References Cited

U.S. PATENT DOCUMENTS

| | | | | |
|---|---|---|---|---|
| 7,576,288 | B2 * | 8/2009 | Kondo | ................. H05K 3/4635 174/262 |
| 9,414,502 | B2 * | 8/2016 | Wu | ........................... H05K 1/14 |

(Continued)

FOREIGN PATENT DOCUMENTS

| | | |
|---|---|---|
| CN | 107211529 A | 9/2017 |
| CN | 108141956 A | 6/2018 |

(Continued)

OTHER PUBLICATIONS

International Search Report issued in corresponding International Patent Application No. PCT/JP2021/041970 issued Feb. 1, 2022 (3 pages).

*Primary Examiner* — Ishwarbhai B Patel
(74) *Attorney, Agent, or Firm* — Osha Bergman Watanabe & Burton LLP

(57) ABSTRACT

A wiring board includes a first substrate, a second substrate composed of a material different from a material of the first substrate, a wiring supported by the first substrate, and a terminal supported by the second substrate and connected to the wiring. The first and second substrates are disposed on a same side with respect to the wiring. In a plan view, the first substrate overlaps the wiring but not the terminal. In the plan view, the second substrate overlaps the terminal.

4 Claims, 4 Drawing Sheets

(51) Int. Cl.
H05K 3/00 (2006.01)
*H05K 1/09* (2006.01)
*H05K 1/18* (2006.01)

(52) U.S. Cl.
CPC ............. H05K 1/117 (2013.01); H05K 3/007 (2013.01); *H05K 1/092* (2013.01); *H05K 1/11* (2013.01); *H05K 1/118* (2013.01); *H05K 1/18* (2013.01); *H05K 2201/2009* (2013.01); *H05K 2203/068* (2013.01)

(58) Field of Classification Search
CPC .. H05K 2203/068; H05K 1/092; H05K 3/249; H05K 3/285; H05K 2201/10151; H05K 1/0278; H05K 3/1216; H05K 2201/0215; H05K 1/117; H05K 3/28; H05K 2201/09236; H05K 2201/10977
See application file for complete search history.

(56) References Cited

U.S. PATENT DOCUMENTS

| | | | | |
|---|---|---|---|---|
| 9,655,241 | B2 * | 5/2017 | Ishida .................... | H05K 1/117 |
| 2010/0319972 | A1 * | 12/2010 | Watanabe .............. | H05K 1/118 |
| | | | | 156/60 |
| 2018/0092206 | A1 | 3/2018 | Iwase et al. | |
| 2020/0113046 | A1 * | 4/2020 | Oka .................... | H05K 1/0281 |
| 2021/0249803 | A1 * | 8/2021 | Kojima .............. | H01B 7/0225 |

FOREIGN PATENT DOCUMENTS

| | | | |
|---|---|---|---|
| JP | 2007-311568 | A | 11/2007 |
| JP | 2010-164692 | A | 7/2010 |
| JP | 2012-028745 | A | 2/2012 |
| JP | 2013-187380 | A | 9/2013 |
| JP | 2018-085377 | A | 5/2018 |
| JP | 2019-165048 | A | 9/2019 |
| TW | 201330727 | A | 7/2013 |
| TW | 201931960 | A | 8/2019 |

* cited by examiner

WIRING BOARD AND METHOD FOR MANUFACTURING WIRING BOARD

BACKGROUND

Technical Field

The present invention relates to a wiring board and a method for manufacturing the wiring board.

Description of the Related Art

In a movable portion and a bent portion of the robot, medical-healthcare module, etc., an elastic flexible printed circuits board that can follow the movement is used (e.g., see Patent Document 1). The elastic flexible printed circuits board include an insulating base material composed of a thermoplastic elastomer having elasticity, a wiring layer having wiring and terminals.

PATENT DOCUMENT

Patent document 1: JP 2013-187380 A

In the above-described flexible printed circuits board, both of the wiring and the terminal of the wiring layer are formed on the same insulating base material. Since the insulating base material is composed of a soft resin material such as polyurethane-based elastomer or the like, when the terminal of the flexible printed circuits board is inserted into and removed from a connector of an external device or the like, this soft insulating base material is greatly recessed. Therefore, poor contact between the terminal and the connector may occur because the large dents in the terminal that follows the dents in the insulating base material is formed.

Further, in the wiring board for molding (molded wiring board), as the insulating base material, rather than the soft resin material as described above, a hard resin material such as ABS resin (acrylonitrile-butadiene-styrene copolymer synthetic resin) is used. In addition, the insulating base material composed of ABS resin or the like are often thicker than the base material of the above-described flexible printed circuits board. In the molded wiring board, the terminal portion may be difficult to bend, even when it is desired to place the molded wiring board with the state that the portion where the terminals are formed (terminal portion) is bent, because the terminals are hard and formed on the insulating base material composed of a thick resin material.

SUMMARY

One or more embodiments provide a wiring board having a suitable terminal portion for a variety of uses.

[1] A wiring board according to one or more embodiments comprises: a first substrate; a second substrate composed of a material different from a material of the first substrate; a wiring supported by the first substrate; and a terminal supported by the second substrate and connected to the wiring. The first and second substrates are disposed on a same side with respect to the wiring, the first substrate, in PLAN view, overlaps the wiring and doesn't overlap the terminal, and the second substrate, in PLAN view, overlaps the terminal.

[2] In one or more embodiments, the wiring board may further comprise: a body portion; and a tail portion extending from the body portion. The body portion may comprise the first substrate and the wiring, and the tail portion may comprise the second substrate and the terminal.

[3] In one or more embodiments, the second substrate may comprise: a first reinforcing board; and a second reinforcing board laminated to the first reinforcing board. The first and second reinforcing boards may overlap the terminal in PLAN view.

[4] In one or more embodiments, the first reinforcing board may be interposed between the terminal and the second reinforcing board, the first reinforcing board may be disposed in contact with the first substrate, the second reinforcing board may be disposed apart from the first substrate.

[5] In one or more embodiments, the wiring board may satisfy a following inequality (1).

$$E_1 < E_2 \tag{1}$$

In the inequality (1), $E_1$ is a Young's modulus of the first substrate and $E_2$ is a Young's modulus of the second substrate.

[6] In one or more embodiments, the wiring board may satisfy a following inequality (2).

$$T_1 > T_2 \tag{2}$$

In the inequality (2), $T_1$ is a thickness of the first substrate and $T_2$ is a thickness of the second substrate.

[7] In one or more embodiments, the wiring board may further comprise: a primer layer interposed between the first substrate and the wiring and between the second substrate and the terminal; and a overcoat layer formed on the primer layer so that the overcoat layer coats the wiring.

[8] In one or more embodiments, the wiring and a body portion of the terminal may be formed integrally.

[9] A method of manufacturing a wiring board according to one or more embodiments, comprises: a first step of preparing a release film; a second step of forming a overcoat layer on the release film; a third step of forming a wiring on the overcoat layer and forming a terminal connected the wiring on the release film; a fourth step of forming a primer layer on the overcoat layer, the wiring, and the terminal; and a fifth step of laminating a first substrate and a second substrate composed of a material different from a material of the first substrate to the primer layer.

In the wiring board according to one or more embodiments, the first substrate supporting the wiring, and the second substrate supporting the terminals, are composed of mutually different materials. Thereby, it is possible to suppress the occurrence of dents of the terminal, or it is possible to easily bend the area where the terminal portion is formed, therefore, it is possible to provide the wiring board having a suitable terminal portion for a variety of uses.

DETAILED DESCRIPTION OF THE EMBODIMENTS

Figure 1:
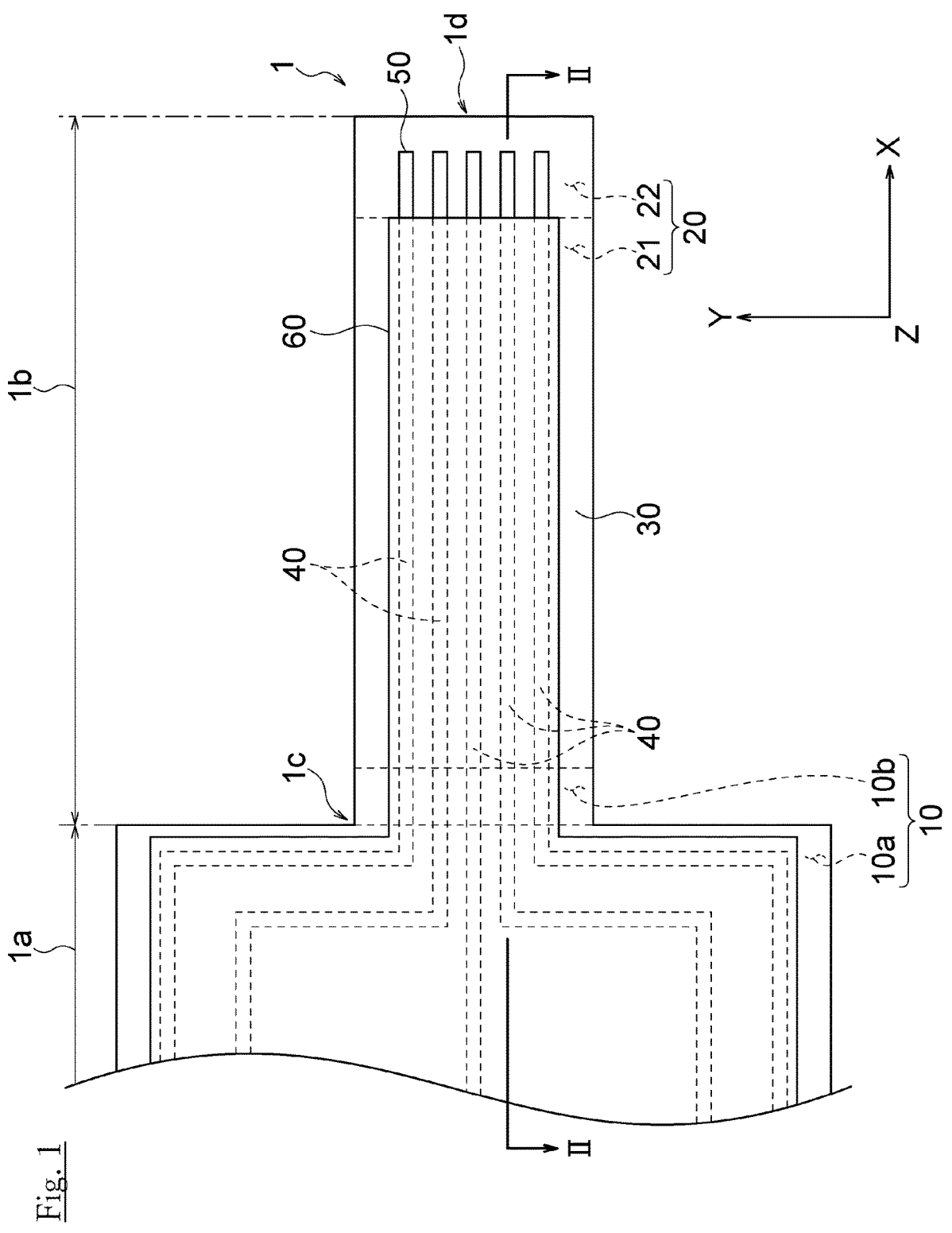
FIG. 1 is a PLAN view showing a wiring board in one or more embodiments.

Hereinafter, embodiments of the present invention will be described with reference to the figures. FIG. 1 is a PLAN view showing a wiring board in one or more embodiments, FIG. 2 is a cross-sectional view taken along the line II-II of FIG. 1.

A wiring board 1 in one or more embodiments is a stretchable wiring board. This stretchable wiring board is used, for example, in a place where stretchability is required of a wearable device such as a biological sensor or a medical device such as a biological information monitor. Since the wearable devices and the medical devices are provided on clothes and orthoses, it is required that the stretchable wiring board sufficiently follows the bending of the human body. The use of the stretchable wiring board is not particularly limited as long as the use requiring a stretchable property.

The wiring board 1 includes a body portion 1a and the tail portion 1b. As shown in FIG. 1, the body portion 1a has a rectangular shape. The tail portion 1b has a band shape. The width (length along the Y direction in the figures) of the tail portion 1b is narrower than that of the body portion 1a. In one or more embodiments, the tail portion 1b is integrally formed with the body portion 1a and extends from the body portion 1a. The tail portion 1b is used as a connecting portion with an external device or other wiring board.

Figure 2:
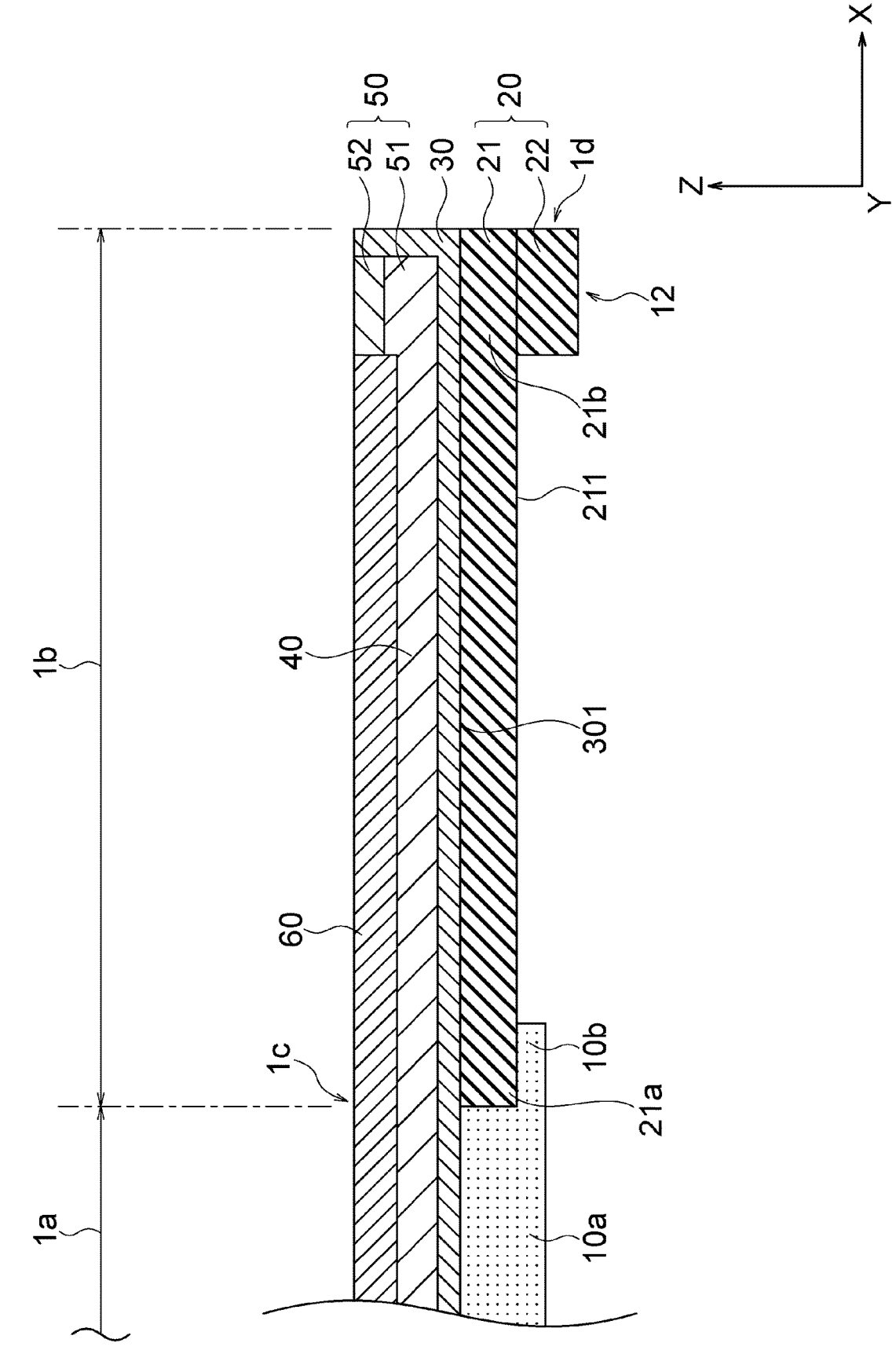
FIG. 2 is a cross-sectional view taken along the line II-II of FIG. 1.

As shown in FIG. 2, the wiring board 1 includes a first substrate 10, a second substrate 20, a primer layer 30, wirings 40, a terminal 50, and an overcoat layer 60. The first substrate 10, the primer layer 30, the wirings 40, and the overcoat layer 60 are disposed in the body portion 1a and the tail portion 1b, but the second substrate 20 and the terminal 50 are disposed in the tail portion 1b.

The first substrate 10 supports the wirings 40 through the primer layer 30. As shown in FIG. 1, the first substrate 10 is disposed from the body portion 1a of the wiring board 1 to the root 1c of the tail portion 1b. The first substrate 10, similarly to the wiring board 1, comprises a body portion 10a having a rectangular shape, and a overlapping portion 10b having a rectangular shape smaller than the body portion 10a.

The body portion of the first substrate 10 is formed on the whole of the body portion 1a of the wiring board 1, the overlapping portion 10b of the first substrate 10 is disposed on the side of the root 1c of the tail portion 1b of the wiring board 1. The body portion 10a and the overlapping portion 10b is integrally formed, the overlapping portion 10b protrudes from the body portion 10a. The width of the overlapping portion 10b (length along the Y direction in the figures) is narrower than the width of the body portion 10a.

In a PLAN view (in PLAN view when the wiring board 1 is viewed from above or below (the normal direction (Z direction in the example of FIGS. 1 and 2) with respect to the main surface of the wiring board 1)), the body portion 10a of the first substrate 10 overlaps the wirings 40, the body portion 10a does not overlap the terminal 50. Similarly, the overlapping portion 10b of the first substrate 10 overlap the wirings 40 in PLAN view, the overlapping portion 10b does not overlap the terminal 50. Further, the overlapping portion 10b overlaps on the first reinforcing board 21 of the second substrate 20 (described later). The first substrate 10 may not overlap the second substrate 20 In other words, the overlapping portion 10b may not be formed. The first substrate 10 may have a tail portion extending from the body portion 10a, the tail portion of the first substrate 10 may be disposed on the tail portion 1b of the wiring board 1. Further, in this case, the distal end portion of the tail portion of the first substrate 10 may overlap the first reinforcing board 21 of the second substrate 20.

This first substrate 10 is stretchable and is composed of, for example, a hot melt layer or an adhesive layer having stretchability. As a material constituting the hot melt layer and the adhesive layer, for example, a hot melt type resin material such as polyurethane, polyester, acrylic, styrene-butadiene rubber, or silicone can be used. The Young's modulus $E_1$ of the first substrate 10 is not particularly limited, may be 0.1 MPa to 35 MPa ($0.1 \text{ MPa} \leq E_1 \leq 35 \text{ MPa}$). The thickness $T_1$ of the first substrate 10 may be 25 to 100 micrometers ($25 \text{ micrometers} \leq T_1 \leq 100 \text{ micrometers}$).

As shown in FIG. 2, the second substrate 20 supports the wirings 40 and the terminals 50 through the primer layer 30. The second substrate 20 and the first substrate 10 described above are disposed on the same side with respect to the wirings 40 (−Y side in one or more embodiments). Thus, since the first and second substrates 10 and 20 are disposed on the same side, it is possible to integrally form the wirings 40 and the terminal 50 by a method for manufacturing described below.

Figure 3:
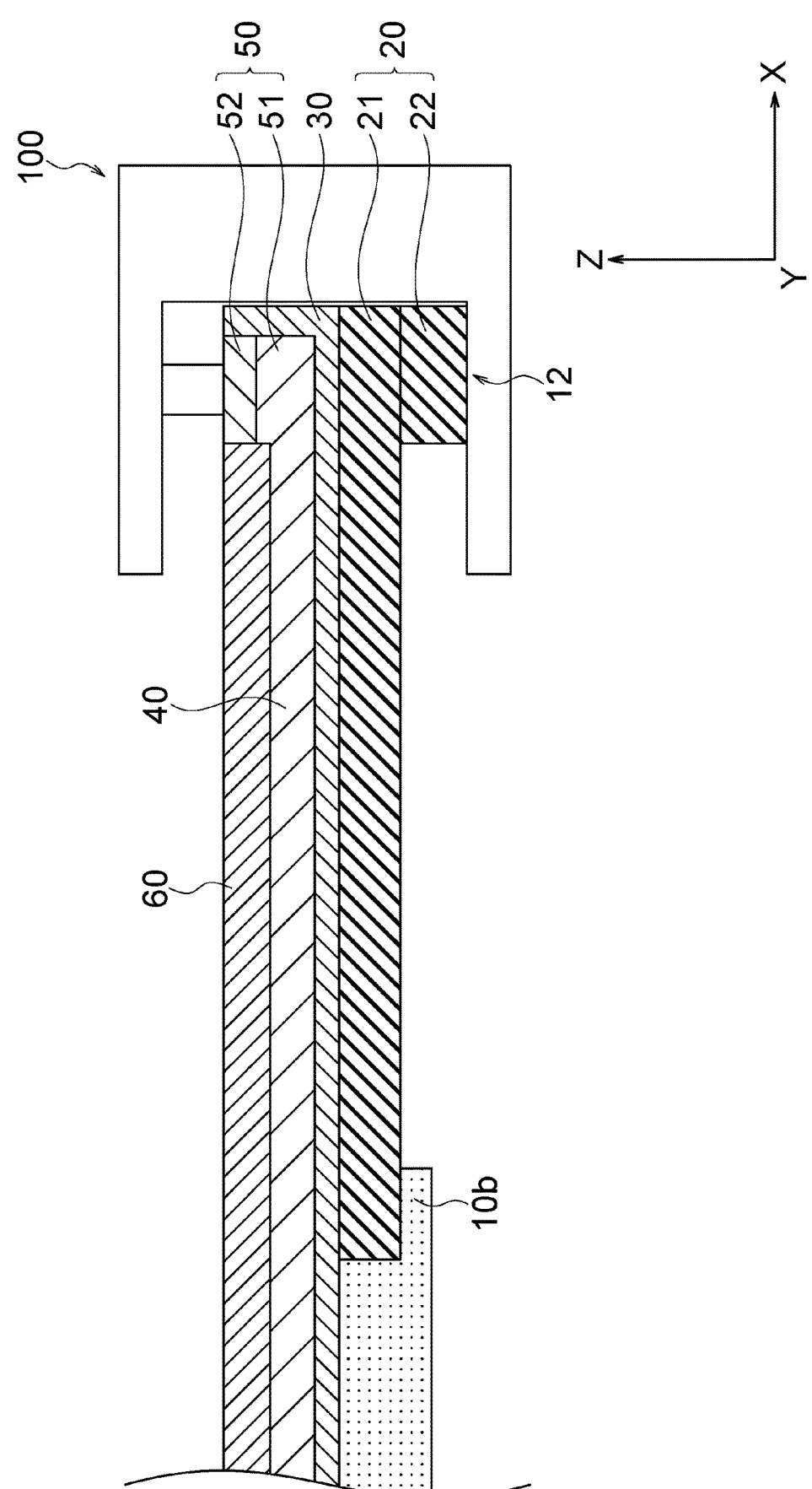
FIG. 3 is a sectional view showing a state of inserting the tail portion of the wiring board into the connector in one or more embodiments.

The second substrate 20 is disposed from the root 1b to the distal end 1d of the tail portion 1c of the wiring board 1, in PLAN view, has a band shape having the same width as the tail portion 1b of the wiring board 1. The second substrate 20, as shown in FIG. 3, is disposed on the connecting portion 12 sandwiched by the connector 100 when the terminal 50 is connected to the connector 100. The thickness of the connecting portion 12 of the wiring board 1 is adjusted by this second substrate 20 to the thickness that conforms to the standard of the opening of the connector 100. Further, the rigidity of the connecting portion 12 of the wiring board 1 is made higher than the rigidity of the other portions by the second substrate 20. In one or more embodiments, the second substrate 20 is not disposed on the body portion 1a, but is not limited thereto. The second substrate 20 may be disposed up to the vicinity of the border of the tail portion 1b of the body portion 1a.

In one or more embodiments, the second substrate 20 has a first reinforcing board 21 and a second reinforcing board 22. Thus, the structure of the second base material 20 consisting of multiple layers (two layers in one or more embodiments) makes it easier to adjust the thickness of the second base material 20 when the wiring board 1 is manufactured. The second substrate 20 may consist of only the first reinforcing board 21 and may not have a second reinforcing board 22.

The first reinforcing board 21, as shown in FIG. 2, is laminated to the lower surface 301 of the primer layer 30, is interposed between the primer layer 30 and the second reinforcing board 22. Further, the first reinforcing board 21, in PLAN view, overlaps the wirings 40 and the terminal 50.

As shown in FIGS. 1 and 2, the first reinforcing board 21 has a band shape having the same width as the width of the tail portion 1b of the wiring board 1, extends from the overlapping portion 10b of the first substrate 10 to the distal end 1d of the tail portion 1b of the wiring board 1.

The first reinforcing board 21 is contacted with the overlapping portion 10b of the first substrate 10, the rear end 21a of the first reinforcing board 21 is covered with the overlapping portion 10b. On the other hand, the distal end 21b of the first reinforcing board 21 is covered by the second reinforcing board 22. Here, the rear end 21a is the end of the first reinforcing board 21 located on the root 1b side of the tail portion 1c of the wiring board 1, and the distal end portion $21b$ is the end of the first reinforcing board 21 located on the distal end $1d$ side of the tail portion $1b$ of the wiring board 1.

The first reinforcing board 21 is made of a material which differs from the first substrate 10. In one or more embodiments, the first reinforcing board 21 is made of a harder material than the material of the first substrate 10, the Young's modulus $E_{2a}$ of the first reinforcing board 21 is greater than the Young's modulus $E_1$ of the first substrate 10 ($E_1 < E_{2a}$). Generally, since the stiffness also increases as Young's modulus increases, when the above relationship of the Young's moduli is satisfied, the first reinforcing board 21 is harder than the first substrate 10. Further, the Young's modulus $E_{2a}$ of the first reinforcing board 21 is not particularly limited, may be 1 GPa to 20 GPa (1 GPa$\leq E_1 \leq$20 GPa). The thickness $T_{2a}$ of the first reinforcing board 21 may be 50 to 200 micrometers (50 micrometers$\leq T_{2a} \leq$200 micrometers).

The first reinforcing board 21 is not particularly limited, for example, an adhesive tape, a PET film, or the like can be used as the first reinforcing board 21. As the adhesive tape, for example, an adhesive tape with an acrylic adhesive layer on the main surface of a polyester film can be used, and the first reinforcing board 21 is disposed by attaching the acrylic adhesive layer to the primer layer 30. In addition, when the PET film is used, the PET film may be attached to the primer layer 30 by an adhesive or the like.

The second reinforcing board 22 is laminated to the lower surface 211 of the first reinforcing board 21. The second reinforcing board 22 is disposed along the distal end $1d$ of the tail portion $1b$, covers the distal end portion $21b$ of the first reinforcing board 21. The second reinforcing board 22 of one or more embodiments, in PLAN view, overlaps only the terminal 50, not overlap the wirings 40. The second reinforcing board 22, in PLAN view, may overlap the wirings 40.

The second reinforcing board 22 has a rectangular shape having the same width as the width of the tail portion $1b$ of the wiring board 1. The length of the second reinforcing board 22 along the extending direction of the tail portion $1b$ of the wiring board 1 (X direction in the figures), since it is shorter than the length of the first reinforcing board 21 along the extending direction, the second reinforcing board 22 covers only the distal end $21b$ of the first reinforcing board 21.

The second reinforcing board 22 is disposed apart from the overlapping portion $10b$ of the first substrate 10. Therefore, in the gap located between the second reinforcing board 22 and the first substrate 10, the lower surface 211 of the first reinforcing board 21 is exposed to the outside. As one or more embodiments, since the second reinforcing board 22 and the first substrate 10 are separated, the stiffness of the tail portion $1b$ does not become too large by the second substrate 20, the tail portion $1b$ can be maintained in a easily bent state.

The second reinforcing board 22 is also composed of a material that differs from the first substrate. Although the second reinforcing board 22 is not particularly limited, the same adhesive tape as the first reinforcing board 21 can be used. Therefore, the second reinforcing board 22 is also made of a harder material than the material of the first substrate 10, the Young's modulus $E_{2b}$ of the second reinforcing board 22 is greater than the Young's modulus $E_1$ of the first substrate 10 ($E_1 < E_{2b}$). Thus, since the second substrate 20 is composed of the first and second reinforcing boards 21 and 22 harder than the first substrate 10, as shown in the following inequality (1), the Young's modulus $E_2$ of the second substrate 20 is also larger than the Young's modulus $E_1$ of the first substrate 10.

$$E_1 < E_2 \tag{1}$$

In the above inequality (1), $E_1$ is the Young's modulus of the first substrate 10, $E_2$ is the Young's modulus of the second substrate 20.

The thickness $T_{2b}$ of the second reinforcing board 22 may be 100 to 250 micrometers (100 micrometers$\leq T_{2a} \leq$250 micrometers). The thickness $T_{2b}$ of the second reinforcing board 22 may be the same thickness as the thickness $T_{2a}$ of the first reinforcing board 21, or may be different from the thickness $T_{2a}$.

The primer layer 30 is disposed on the first and second substrate 10 and 20 in the body portion $1a$ and the tail portion $1b$ of the wiring board 1. In one or more embodiments, the primer layer 30 is formed on the entire surface of the first and 2 substrates 10, 20. Therefore, the planar shape of the primer layer 30 is substantially the same shape as the overall planar shape of the first and second substrates 10, 20. Further, the primer layer 30 is stretchable. Incidentally, the primer layer 30 may be omitted, in this case, the wirings 40 and the overcoat layer 60 are directly supported on the first substrate 10, the wirings 40, the terminal 50, and the overcoat layer 60 are directly supported on the second substrate 20.

The primer layer 30 covers the lower surface and the side surface of the wirings 40 and the terminal 50. When the wiring board 1 is extended, the primer layer 30 functions as a buffer layer for preventing breakage of the wirings 40 and the terminal 50, and also functions as a waterproof layer. Although there is no particular limitation on the material constituting such a primer layer 30, for example, a polyester resin, a polyurethane resin, an acrylic resin, a silicone resin, or the like can be used. The Young's modulus $E_3$ of the primer layer 30 is not particularly limited, but is preferably 0.1 to 10 MPa (0.1 MPa$\leq E_3 \leq$10 MPa). The thickness $T_3$ of the primary layer 30 may be 10 to 50 micrometers (10 micrometers$\leq T_3 \leq$50 micrometers).

A plurality (five in this example) of wirings 40 are disposed on the primer layer 30. The wirings 40 are embedded in the primer layer 30 so that the lower and side surfaces of the wirings are covered, and the upper surfaces thereof are covered with the overcoat layer 60, the upper surfaces is not exposed to the outside. The wirings 40, as shown in FIG. 1, are formed from the tail portion $1b$ of the wiring board 1 to the body portion $1a$.

The wirings 40 are formed by dispersing conductive particles in a binder, and have stretchability. Here, the binder included in the wirings 40 is made of a material having stretchability, so that stretchability is imparted to the wirings 40. As this binder, an elastomer such as, for example, acrylic rubber, urethane rubber, nitrile rubber, silicone rubber, fluorine rubber, a composite of two or more of these, and the like can be preferably used.

As the conductive particles, gold, silver, platinum, ruthenium, lead, tin, zinc, a metal made of a metal such as bismuth or an alloy thereof, or a non-metallic material such as carbon can be used. The shape of the conductive particles is preferably a shape which is scaly or indefinite.

The Young's modulus $E_4$ of the wiring 40 is not particularly limited, but may be 10 to 200 MPa (10 MPa$\leq E_4 \leq$200 MPa).

At one end of the wiring 40, the terminal 50 is formed. Further, similarly to the wirings 40, the terminal 50 is embedded in the primer layer 30 so that the lower and side surfaces are covered, but are not covered by the overcoat layer 60, the upper surface of the terminal 50 is exposed to the outside. The terminal 50 can be used as a connection terminal to the connector 100 (see FIG. 3), it is possible to ensure conduction between the electronic component or the like through the connector 100.

The terminal 50 has a body portion 51, and a protective layer 52. The body portion 51 is integrally formed with the wirings 40. The body portion 51 is composed of the same material as that of the wirings 40. Incidentally, the terminal 50 may be composed of only the body portion 51, may not have a protective layer 52.

The protective layer 52 is disposed on the body portion 51 to protect the body portion 51 from contact with the connector 100. The material constituting the protective layer 52 is different from the material constituting the body portion 51 Although not particularly limited, as an example, carbon may be used as the conductive particles included in the protective layer 52, and silver may be used as the conductive particles included in the body portion 51.

The overcoat layer 60 is disposed on the primer layer 30 so as to cover the wirings 40, and protects the wirings 40. In one or more embodiments, the overcoat layer 60 is not formed on the entire surface on the primer layer 30, is formed only in a portion where the wirings 40 is formed.

Similar to the primer layer 30, the overcoat layer 60 is stretchable. The material constituting the overcoat layer 60 is not particularly limited, for example, polyester, polyurethane, acrylic, and silicone may be used.

The Young's modulus $E_6$ of the overcoat layer 60 is preferably higher than the Young's modulus $E_3$ of the primer layer 30 ($E_6 > E_3$), and more preferably lower than the Young's modulus $E_4$ of the wirings 40 ($E_6 < E_4$). The Young's modulus $E_6$ of the overcoat layer 60 is preferably 5 to 100 MPa (5 MPa$\leq E_6 \leq$100 MPa). The thickness $T_6$ of the overcoat layer 60 may be 10 to 20 micrometers (10 micrometers$\leq T_6 \leq$20 micrometers).

Further, it is preferable that the material constituting the overcoat layer 60 and the material constituting the primer layer 30 be substantially the same material. In this case, the interface between the primer layer 30 and the overcoat layer 60 is slightly visible, the primer layer 30 and the overcoat layer 60 is substantially integrated.

Here, the temperature of the wiring board changes, according to the method of use, due to heating by Joule heat caused by the terminals and wiring being energized and the dissipation of the Joule heat, and the wiring board may repeat thermal expansion and contraction. In this case, if the first base material is present over the entire surface of the wiring board including the terminal formation area, the portion of the first substrate that is sandwiched by the connector will become concave due to repeated thermal expansion and contraction. If there is no second substrate and the first substrate is present up to the distal end of the tail portion, the first substrate is too soft to connect the connector to the terminals in the first place.

In contrast, in the wiring board 1 of one or more embodiments, the first substrate 10 and the second substrate 20 is composed of different materials, the second substrate 20 is harder than the first substrate 10. Then, only the hard second substrate 20 overlaps the terminal 50 in PLAN view. Therefore, as shown in FIG. 3, when the terminal 50 and the connector 100 are connected, since the second substrate 20 is hardly recessed, the terminal 50 hardly recessed. Therefore, it is possible to suppress the occurrence of contact failure of the terminal 50 and the connector 100.

Figure 4:
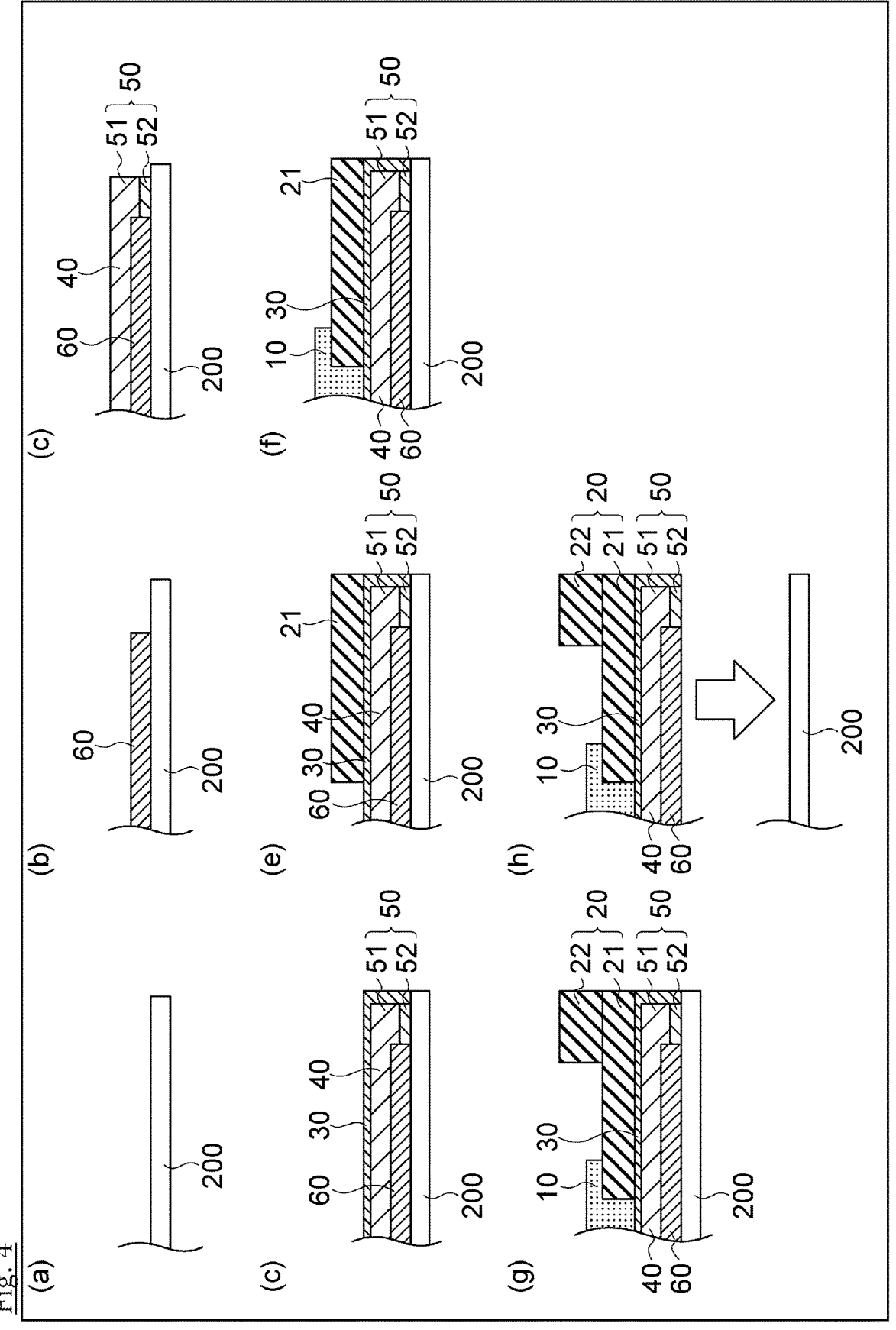
FIG. 4 is a sectional view showing a method of manufacturing the wiring board according to one or more embodiments.

Next, a method for manufacturing the wiring board 1 of one or more embodiments will be described with reference to FIG. 4. FIG. 4 is a sectional view showing a method of manufacturing the wiring board 1 in one or more embodiments.

First, as shown in FIG. 4 (*a*), a release film 200 is prepared. This release film 200 is a resin film subjected to a release process, and is not particularly limited, and for example, a release treatment PET film can be used as the release film 200. Since the release film 200 is peeled off in the step of FIG. 4 (*h*) described later and does not constitute a part of the wiring board 1, it is preferable to use an inexpensive film as the release film 200.

Next, as shown in FIG. 4 (*b*), the overcoat layer 60 of a predetermined pattern is formed on one main surface of the release film 200. At this time, the overcoat layer 60 is not formed in the region where the terminal 50 is formed. The overcoat layer 60 is formed by coating the material constituting the overcoat layer 60 described above on the release film 200 and curing the material. As the coating method, various coating methods such as a screen printing method, a spray coating method, a bar coating method, a dip method, and an inkjet method can be employed. As a curing method, irradiation with energy rays such as ultraviolet rays and infrared laser rays, heating, heating and cooling, and drying, or the like can be employed.

Next, as shown in FIG. 4 (*c*), the terminal 50 and the wirings 40 are formed. The wirings 40 and the terminal 50 are formed by coating a conductive paste on the release film 200 and on the overcoat layer 60 and by curing the conductive paste. As an example of the conductive paste, a conductive paste formed by mixing conductive particles, a binder, water or a solvent, and various additives can be exemplified. Examples of the solvent contained in the conductive paste include butyl cellosolve acetate, carbitol acetate, butyl carbitol acetate, dipropylene glycol monobutyl Ether, diethylene glycol monoethyl Ether, cyclohexanone, isophorone, and terpineol. As for the coating method and the curing method, the same method as in the case of forming the overcoat layer 60 can be used.

In one or more embodiments, the body portion 51 of the wirings 40 and the terminal 50 is composed of the same material, and is integrally formed. On the other hand, the protective layer 52 of the terminal 50 is made of a material different from those of the wirings 40 and the body portion 51. Therefore, in one or more embodiments, for example, first, a carbon paste may be applied and cured on the release film 200 to form the protective layer 52, and then the wirings 40 and the body portion 51 may be formed by applying and curing the silver paste on the overcoat layer 60 and the protective layer 52 It is noted that the carbon paste forming the protective layer 52 and the silver paste forming the wirings 40 and the body portion 51 may be simultaneously cured.

Next, as shown in FIG. 4 (*d*), the primer layer 30 is formed on the release film 200 so as to cover the wirings 40 and the terminal 50. The primer layer 30 is formed by applying the resin material described above and curing it. As for the coating method and the curing method, the same method as in the case of forming the overcoat layer 60 can be used.

Next, as shown in FIG. 4 (*e*), the first reinforcing board 21 is laminated to the primer layer 30. Specifically, the first reinforcing board 21 is formed by attaching the adhesive layer of the above adhesive tape to the primer layer 30.

Next, as shown in FIG. 4 (*f*), a first substrate 10 is formed on the primer layer 30 and the first reinforcing board 21. The first substrate 10 can be formed by attaching a sheet-like hot melt adhesive to the primer layer 30 and the first reinforcing board 21 using a thermal laminator or the like. It is noted that the first substrate 10 may be formed by coating a thermoplastic hot melt adhesive on the primer layer 30 and the first reinforcing board 21. At this time, the thermoplastic hot melt adhesive may be heated to be formed into any desired shape.

Next, as shown in FIG. 4 (g), so as not to touch the first substrate 10, the second reinforcing board 22 is attached to the first reinforcing board 21. Specifically, after the adhesive layer of the above adhesive tape is attached to the first reinforcing board 21, the second reinforcement plate 22 is attached to the first reinforcement plate 21 via the adhesive tape. In one or more embodiments, the second reinforcing board 22 is attached to the first reinforcing board 21 after the formation of the first substrate 10, but is not limited thereto. The second reinforcing board 22 may be attached to the first reinforcing board 21 prior to the formation of the first substrate 10.

In the method for manufacturing the wiring board 1 according to one or more embodiments, the smooth surface shape of the release film 200 is transferred to the surface of the terminal and the surface of the overcoat layer 60. Therefore, the both surfaces are smooth and the generation of steps at the boundary between the surfaces can be suppressed (the surfaces are flush). As a result, when the wiring board 1 is used in the wearable device or the like, the unevenness on the surface (top surface) of the wiring board 1 can be reduced to the extent that the user does not feel any discomfort.

Further, in one or more embodiments, the case where the wiring board 1 is an stretchable wiring board has been described as an example, but the present invention is not limited thereto. For example, the wiring board 1 may be a molded wiring board. Incidentally, the molded wiring board is a wiring board which is molded into a predetermined three-dimensional shape having a curved shape or the like by being thermoformed or vacuum molded. The molded wiring board is incorporated into the electronic device or the like after being molded.

When the wiring board 1 is a molded wiring board, the molded wiring board differs from the stretchable wiring board in that the first substrate 10 is made of a material such as ABS or polycarbonate, which is harder than the material constituting of the second substrate 20, and the first substrate 10 is thicker than the second substrate 20.

When the first substrate 10 is made of ABS, polycarbonate, or the like, the Young's modulus of the first substrate 10 is about the same as that of the second substrate 20 made of the adhesive tape, the PET, or the like. Then, as shown in a following inequality (2), the thickness $T_1$ of the first substrate 10 is thicker than the thickness $T_2$ of the second substrate 20. Therefore, the second substrate 20 is more easily bent than the first substrate 10.

$$T_1 > T_2 \quad (2)$$

In one or more embodiments, since only this second substrate 20 overlaps the terminal 50 in PLAN view, it is possible to easily bend the part of the tail portion 1b where the terminal 50 is formed.

Further, when the wiring board 1 is the molded wiring board, the thickness $T_1$ of the first substrate 10 may be 0.5 mm or more ($0.5 \leq T_1$). If the thickness $T_1$ of the first substrate 10 is 0.5 mm or more, the first substrate 10 is less likely to tear when the wiring board 1 is formed It is noted that the thickness $T_1$ of the first substrate 10 may be 5 mm or less.

Further, when the wiring board 1 is the molded wiring board, the thickness $T_2$ of the second substrate 20 may be 0.3

10 mm or less ($T_2 \leq 0.3$ mm). If the thickness $T_2$ of the second substrate 20 is 0.3 mm or less, the flexibility of the second substrate 20 can be ensured and the thickness near the terminal 50 can be adjusted to a thickness suitable for connecting the connector 100. It is noted that the thickness $T_2$ of the second substrate 20 may be 50 micrometers or more (50 micrometers$\leq T_2$).

As described above, according to the wiring board 1 in one or more embodiments, the wiring board having a suitable terminal portion for a variety of uses can be provided.

Embodiments heretofore explained are described to facilitate understanding of the present invention and are not described to limit the present invention. It is therefore intended that the elements disclosed in the above embodiments include all design changes and equivalents to fall within the technical scope of the present invention. Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

For example, in the above embodiments, the first substrate 10 and the second substrate are arranged in the tail portion 1b of the wiring board 1, but the lowermost layer of the tail portion 1b may be composed of only the second substrate when the wiring board 1 is the molded wiring board. In this way, it is possible to easily bend the entire tail portion 1b.

REFERENCE SIGNS LIST

1 . . . Wiring board
1a . . . Body portion
1b . . . Tail portion
1c . . . Root
1d . . . Distal end
10 . . . . First substrate
10a . . . Body portion
10b . . . Overlapping portion
20 . . . Second substrate
21 . . . First reinforcing board
21a . . . Rear end
21b . . . Distal end
211 . . . Lower surface
22 . . . Second reinforcing board
30 . . . Primer layer
40 . . . Wiring
50 . . . Terminal
51 . . . Body portion
52 . . . Protection layer
60 . . . Overcoat layer
100 . . . Connector
200 . . . Releasing film

The invention claimed is:
1. A wiring board comprising:
a first substrate;
a second substrate composed of a material different from a material of the first substrate;
a wiring supported by the first substrate; and
a terminal supported by the second substrate and connected to the wiring, wherein
the first and second substrates are disposed on a same side with respect to the wiring,
in a PLAN view:
the first substrate overlaps the wiring but not the terminal, and the second substrate overlaps the terminal, the wiring board further comprises:

a body portion comprising the first substrate and the wiring; and a tail portion extending from the body portion and comprising the second substrate and the terminal, the second substrate comprises:

a first reinforcing board; and a second reinforcing board laminated to the first reinforcing board, the first and second reinforcing boards overlap the terminal in the PLAN view, the first reinforcing board is disposed between the terminal and the second reinforcing board, the first reinforcing board contacts the first substrate, the second reinforcing board is disposed apart from the first substrate, and the second reinforcing board does not overlap the first substrate in the PLAN view.

2. The wiring board according to claim 1, wherein the wiring board satisfies $E_1 < E_2$ where $E_1$ is a Young's modulus of the first substrate, and $E_2$ is a Young's modulus of the second substrate.

3. The wiring board according to claim 1, wherein the wiring board satisfies $T_1 > T_2$ where $T_1$ is a thickness of the first substrate, and $T_2$ is a thickness of the second substrate.

4. The wiring board according to claim 1, further comprising:

a primer layer disposed between the first substrate and the wiring and between the second substrate and the terminal; and an overcoat layer disposed on the primer layer and coating the wiring.

* * * * *